United States Patent
Verhagen et al.

(10) Patent No.: US 8,958,051 B2
(45) Date of Patent: *Feb. 17, 2015

(54) LITHOGRAPHIC APPARATUS, DEVICE MANUFACTURING METHOD AND APPARATUS FOR DE-GASSING A LIQUID

(75) Inventors: Martinus Cornelis Maria Verhagen, Valkenswaard (NL); Roelof Frederick De Graaf, Veldhoven (NL); Johannes Henricus Wilhelmus Jacobs, Eindhoven (NL); Franciscus Johannes Herman Maria Teunissen, Rotterdam (NL); Jurgen Benischek, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 561 days.

This patent is subject to a terminal disclaimer.

(21) Appl. No.: 13/335,129

(22) Filed: Dec. 22, 2011

(65) Prior Publication Data

US 2012/0097034 A1   Apr. 26, 2012

Related U.S. Application Data

(63) Continuation of application No. 12/198,448, filed on Aug. 26, 2008, now Pat. No. 8,107,053, which is a continuation of application No. 11/067,492, filed on Feb. 28, 2005, now Pat. No. 7,428,038.

(51) Int. Cl.
| | |
|---|---|
| G03B 27/52 | (2006.01) |
| G03B 27/42 | (2006.01) |
| G03F 7/20 | (2006.01) |

(52) U.S. Cl.
CPC ............................... *G03F 7/70341* (2013.01)
USPC .............................................. 355/30; 355/53

(58) Field of Classification Search
CPC .................................................. G03F 7/70341
USPC ........................................ 355/30, 53; 250/548
See application file for complete search history.

(56) References Cited

U.S. PATENT DOCUMENTS

| | | | |
|---|---|---|---|
| 3,573,975 | A | 4/1971 | Dhaka et al. |
| 3,648,587 | A | 3/1972 | Stevens |
| 4,346,164 | A | 8/1982 | Tabarelli et al. |

(Continued)

FOREIGN PATENT DOCUMENTS

| | | |
|---|---|---|
| DE | 206 607 | 2/1984 |
| DE | 221 563 | 4/1985 |

(Continued)

OTHER PUBLICATIONS

M. Switkes et al., "Immersion Lithography at 157 nm", MIT Lincoln Lab, Orlando Jan. 2001, Dec. 17, 2001.

(Continued)

*Primary Examiner* — Hung Henry Nguyen

(74) *Attorney, Agent, or Firm* — Pillsbury Winthrop Shaw Pittman LLP

(57) ABSTRACT

An apparatus configured to de-gas a liquid includes a semi-permeable membrane having a first side on which the liquid is provided; and (i) a vaporizer configured to provide vapor of the liquid to a second side of the membrane; or (ii) a gas inlet configured to provide a gas to the second side of the membrane, the gas adapted to dissociate when dissolved in the liquid and an ion exchanger for the liquid downstream of the semi-permeable membrane.

19 Claims, 3 Drawing Sheets

(56) References Cited

U.S. PATENT DOCUMENTS

| | | |
|---|---|---|
| 4,390,273 A | 6/1983 | Loebach et al. |
| 4,396,705 A | 8/1983 | Akeyama et al. |
| 4,480,910 A | 11/1984 | Takanashi et al. |
| 4,509,852 A | 4/1985 | Tabarelli et al. |
| 4,935,151 A | 6/1990 | Do |
| 5,040,020 A | 8/1991 | Rauschenbach et al. |
| 5,121,256 A | 6/1992 | Corle et al. |
| 5,610,683 A | 3/1997 | Takahashi |
| 5,735,076 A | 4/1998 | Masui et al. |
| 5,825,043 A | 10/1998 | Suwa |
| 5,900,354 A | 5/1999 | Batchelder |
| 5,993,518 A | 11/1999 | Tateyama |
| 6,191,429 B1 | 2/2001 | Suwa |
| 6,236,634 B1 | 5/2001 | Lee et al. |
| 6,267,891 B1 | 7/2001 | Tonelli et al. |
| 6,379,796 B1 | 4/2002 | Uenishi et al. |
| 6,461,407 B2 | 10/2002 | Takamatsu et al. |
| 6,600,547 B2 | 7/2003 | Watson et al. |
| 6,603,130 B1 | 8/2003 | Bisschops et al. |
| 7,053,983 B2 | 5/2006 | Tokita |
| 7,317,504 B2 | 1/2008 | De Smit et al. |
| 7,379,155 B2 | 5/2008 | Mertens et al. |
| 7,428,038 B2 * | 9/2008 | Verhagen et al. ............... 355/53 |
| 7,733,459 B2 * | 6/2010 | Dierichs et al. ............... 355/30 |
| 8,107,053 B2 * | 1/2012 | Verhagen et al. ............... 355/53 |
| 2001/0002573 A1 | 6/2001 | Takamatsu et al. |
| 2002/0020821 A1 | 2/2002 | Van Santen et al. |
| 2002/0163629 A1 | 11/2002 | Switkes et al. |
| 2003/0123040 A1 | 7/2003 | Almogy |
| 2004/0000627 A1 | 1/2004 | Schuster |
| 2004/0075895 A1 | 4/2004 | Lin |
| 2004/0114117 A1 | 6/2004 | Bleeker |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0207824 A1 | 10/2004 | Lof et al. |
| 2004/0211920 A1 | 10/2004 | Maria Derksen et al. |
| 2004/0239954 A1 | 12/2004 | Bischoff |
| 2004/0263809 A1 | 12/2004 | Nakano |
| 2005/0007569 A1 | 1/2005 | Streefkerk et al. |
| 2005/0018155 A1 | 1/2005 | Cox et al. |
| 2005/0024609 A1 | 2/2005 | De Smit et al. |
| 2005/0030497 A1 | 2/2005 | Nakamura |
| 2005/0046813 A1 | 3/2005 | Streefkerk et al. |
| 2005/0046934 A1 | 3/2005 | Ho et al. |
| 2005/0052632 A1 | 3/2005 | Miyajima |
| 2005/0078286 A1 | 4/2005 | Dierichs et al. |
| 2005/0094116 A1 | 5/2005 | Flagello et al. |
| 2005/0094125 A1 | 5/2005 | Arai |
| 2005/0122505 A1 | 6/2005 | Miyajima |
| 2005/0132914 A1 | 6/2005 | Mulkens et al. |
| 2005/0134817 A1 | 6/2005 | Nakamura |
| 2005/0140948 A1 | 6/2005 | Tokita |
| 2005/0146693 A1 | 7/2005 | Ohsaki |
| 2005/0146694 A1 | 7/2005 | Tokita |
| 2005/0151942 A1 | 7/2005 | Kawashima |
| 2005/0185155 A1 | 8/2005 | Kishikawa |
| 2005/0200815 A1 | 9/2005 | Akamatsu |
| 2005/0213065 A1 | 9/2005 | Kitaoka |
| 2005/0213066 A1 | 9/2005 | Sumiyoshi |
| 2005/0219489 A1 | 10/2005 | Nei et al. |
| 2005/0219490 A1 | 10/2005 | Owa |
| 2005/0233081 A1 | 10/2005 | Tokita |

FOREIGN PATENT DOCUMENTS

| | | |
|---|---|---|
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1420300 | 5/2004 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 09-155169 | 6/1997 |
| JP | 10-228661 | 8/1998 |
| JP | 0200051606 | * 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-051606 | 2/2000 |
| JP | 2000-058436 | 2/2000 |
| JP | 2001-091849 | 4/2001 |
| JP | 2003-010604 | 1/2003 |
| JP | 2003-062403 | 3/2003 |
| JP | 2004-193252 | 7/2004 |
| JP | 2005-005713 | 1/2005 |
| WO | WO 99/49504 | 9/1999 |
| WO | 2004/053596 A2 | 6/2004 |
| WO | 2004/053950 A1 | 6/2004 |
| WO | 2004/053951 A1 | 6/2004 |
| WO | 2004/053952 A1 | 6/2004 |
| WO | 2004/053953 A1 | 6/2004 |
| WO | 2004/053954 A1 | 6/2004 |
| WO | 2004/053955 A1 | 6/2004 |
| WO | 2004/053956 A1 | 6/2004 |
| WO | 2004/053957 A1 | 6/2004 |
| WO | 2004/053958 A1 | 6/2004 |
| WO | 2004/053959 A1 | 6/2004 |
| WO | 2004/055803 A1 | 7/2004 |
| WO | 2004/057589 A1 | 7/2004 |
| WO | 2004/057590 A1 | 7/2004 |
| WO | 2004/090577 | 10/2004 |
| WO | 2004/090633 | 10/2004 |
| WO | 2004/090634 | 10/2004 |
| WO | 2004/092830 | 10/2004 |
| WO | 2004/092833 | 10/2004 |
| WO | 2004/093130 | 10/2004 |
| WO | 2004/093159 | 10/2004 |
| WO | 2004/093160 | 10/2004 |
| WO | 2004/095135 | 11/2004 |
| WO | 2005/010611 | 2/2005 |
| WO | 2005/015315 | 2/2005 |
| WO | 2005/024517 | 3/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

(56) References Cited

OTHER PUBLICATIONS

B.W. Smith et al., "Immersion Optical Lithography at 193nm", FUTURE FAB International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International Sematech, Los Angeles, Jan. 27-29, 2004, Slide Nos. 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

Japanese Office Action mailed Dec. 21, 2011 in corresponding Japanese Patent Application No. 2009-178556.

* cited by examiner

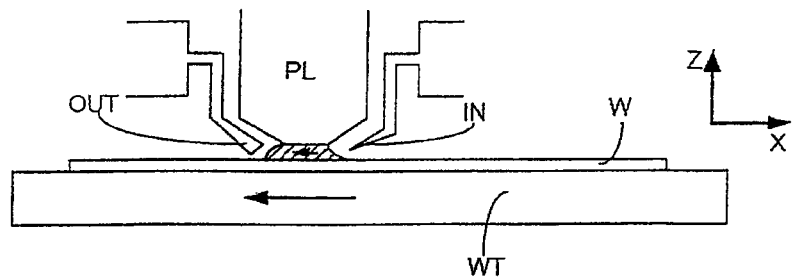
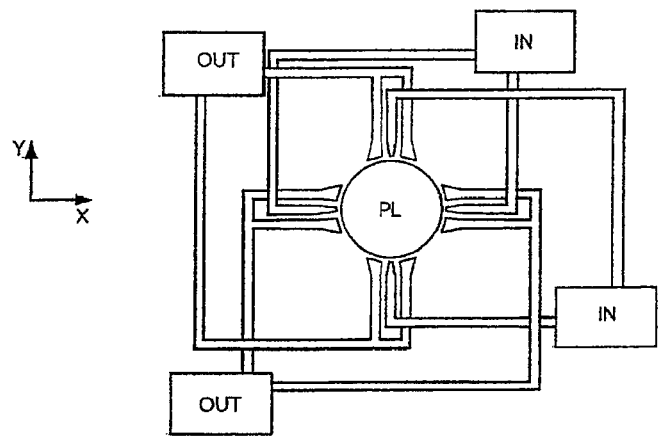
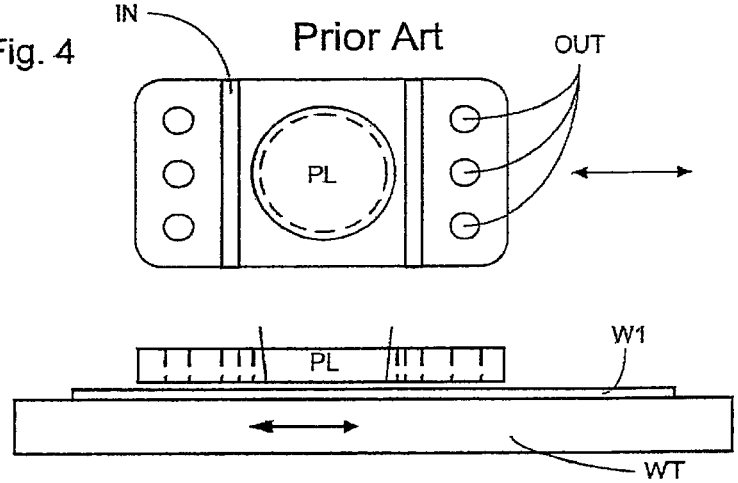

LITHOGRAPHIC APPARATUS, DEVICE MANUFACTURING METHOD AND APPARATUS FOR DE-GASSING A LIQUID

CROSS REFERENCE TO RELATED APPLICATIONS

This application is a continuation of U.S. patent Ser. No. 12/198,448, filed Aug. 26, 2008, which issued as U.S. Pat. No. 8,107,053 on Jan. 31, 2012, which is a continuation of U.S. patent Ser. No. 11/067,492, filed Feb. 28, 2005, now U.S. Pat. No. 7,428,038, the content of which are incorporated herein in their entirety by reference.

FIELD

The present invention relates to a lithographic apparatus and a method for manufacturing a device and an apparatus for de-gassing a liquid.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, United States patent U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application publication WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

One or more unexpected problems may emerge from this new immersion lithography technology when compared with 'dry' lithographic apparatus that do not have liquid in the exposure radiation path. On possible problem is that, despite the improved resolution, the liquid may tend to degrade the image quality in other respects. In particular, bubbles in the immersion liquid may reduce the quality of the imaged pattern.

SUMMARY

Accordingly, it would be advantageous, for example, to provide for de-gassing of a liquid to be used in immersion lithography.

According to an aspect of the invention, there is provided a lithographic apparatus, comprising:

a semi-permeable membrane;

a liquid inlet adapted to supply liquid to a first side of the membrane; and a gas inlet adapted to supply to a second side of the membrane either:

(a) a vapor of the liquid; or (b) a gas which dissociates when dissolved in the liquid.

According to an aspect of the invention, there is provided a device manufacturing method, comprising:

transferring a pattern from a patterning device through a liquid onto a substrate, wherein the liquid was provided on one side of a semi-permeable membrane and a gas provided on another side of the semi-permeable membrane, the gas being either a vapor of the liquid or a gas which dissociates when dissolved in the liquid.

According to an aspect of the invention, there is provided an apparatus configured to de-gas a liquid, the apparatus comprising:

a semi-permeable membrane;

a pump configured to provide the liquid to a first side of the membrane; and either (i) a vaporizer configured to provide vapor of the liquid to a second side of the membrane; or (ii) a gas inlet configured to provide a gas which dissociates when dissolved in the liquid and an ion exchanger for the liquid downstream of the semi-permeable membrane.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts a further liquid supply system for use in a lithographic projection apparatus;

DETAILED DESCRIPTION

Figure 1:
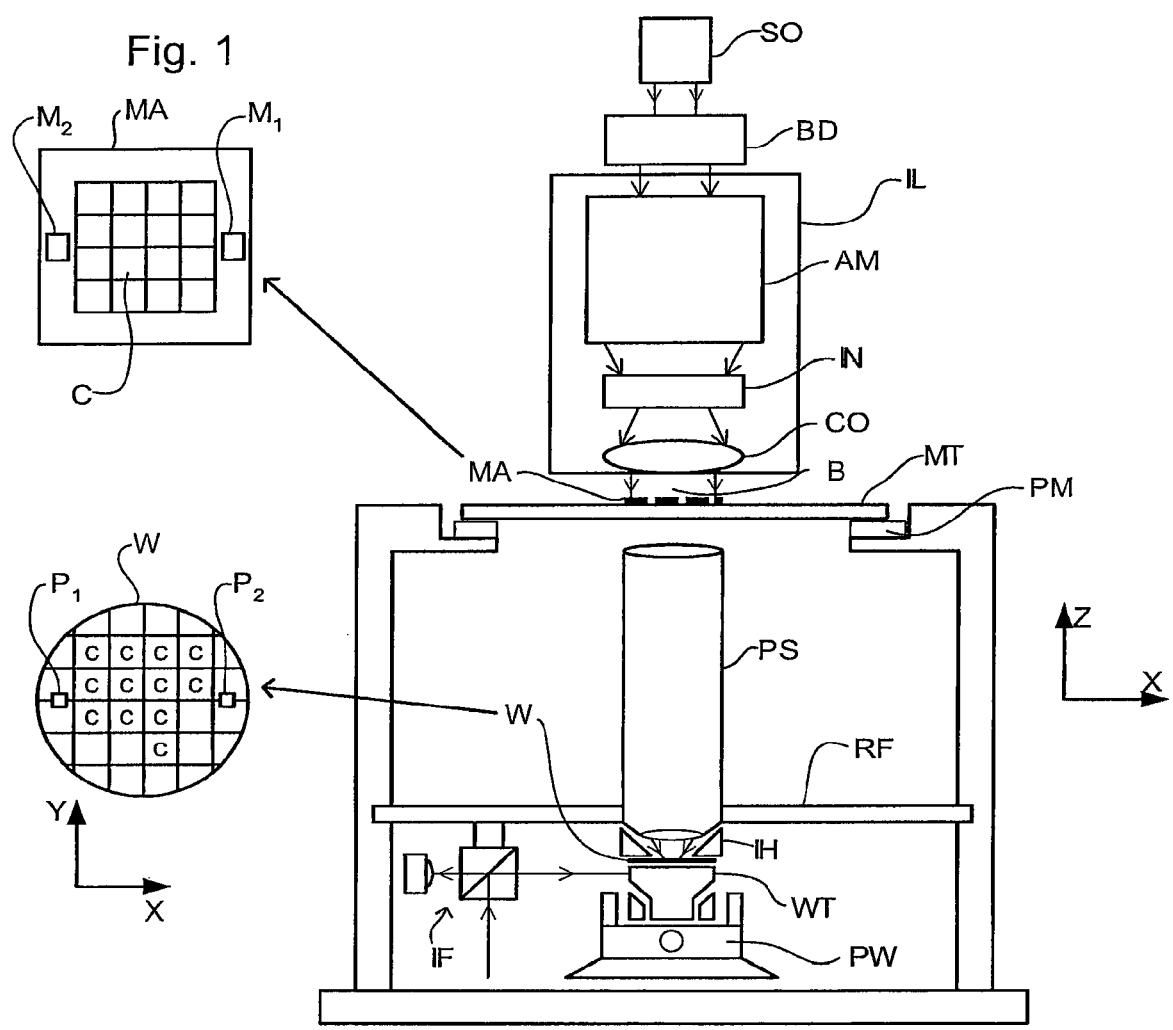
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables or support structures may be used in parallel, or preparatory steps may be carried out on one or more tables or support structures while one or more other tables or support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
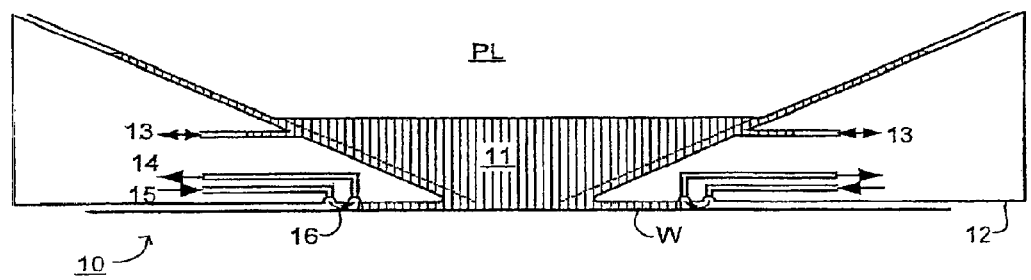
FIG. 5 depicts another liquid supply system for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). See, for example, U.S. patent application Ser. No. 10/844,575, hereby incorporated in its entirety by reference. A seal is typically formed between the liquid confinement structure and the surface of the substrate. In an embodiment, the seal is a contactless seal such as a gas seal.

Referring to FIG. 5, reservoir 10 forms a contactless seal to the substrate around the image field of the projection system so that liquid is confined to fill a space between the substrate surface and the final element of the projection system. The reservoir is formed by a liquid confinement structure 12 positioned below and surrounding the final element of the projection system PL. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure 12 and the surface of the substrate W. The gas seal is formed by gas, e.g. air or synthetic air but, in an embodiment, $N_2$ or another inert gas, provided under pressure via inlet 15 to the gap between liquid confinement structure 12 and substrate and extracted via first outlet 14. The overpressure on the gas inlet 15, vacuum level on the first outlet 14 and geometry of the gap are arranged so that there is a high-velocity gas flow inwards that confines the liquid.

An embodiment of the present invention relates to an apparatus for de-gassing a liquid. The apparatus may either be a stand alone apparatus or coupled to a lithographic projection apparatus. The de-gasser may be used to de-gas liquids such as photo-resist used in lithography. However, an embodiment is particularly suited for de-gassing immersion fluid which will be used in immersion lithography. In immersion lithography, immersion liquid is typically positioned between the final element of the projection system PS and the substrate W.

U.S. patent application Ser. Nos. 10/860,662 and 10/924,192, both of which are incorporated herein in their entirety by reference, discuss the use of bubble reduction apparatus to reduce the occurrence of bubbles in immersion liquid. In these bubble reduction apparatus, liquid is passed past a semi-permeable membrane which has pores which the liquid molecules cannot pass through. In this way the liquid is de-gassed. In an embodiment, the process is accelerated by applying to the outside of the tubing a low pressure.

Membranes are used for removal of gasses from liquids in fields such as microelectronics, pharmaceutical and power applications. The liquid can be pumped through a bundle of semi-porous membrane tubing (shown schematically in FIG. 7) using, for example, a pump. Thus the liquid is de-gassed. The process may be accelerated by applying to the outside of the tubing a low pressure. Liqui-Cel™ Membrane Contractors available from Membrana-Charlotte, a division of Celgard Inc. of Charlotte, N.C., USA are suitable for this purpose and for an embodiment of the present invention as are Mykrolis Phasor II® membranes or Fiberflo® membranes from Minntech. Membranes which are made of a liquidphobic (e.g., hydrophobic) material are advantageous; the pores in the membrane may be larger than the liquid molecules but, because of the surface tension of the liquid, they cannot pass the membrane. Such membranes are typically only suited for use with liquids with a relatively high surface tension such as water.

A problem with the foregoing method is that the amount of dissolved gas in the liquid is proportional to the saturation concentration of the concerned gas in the liquid and the pressure of that gas on the other side of the semi-permeable membrane. This means that the gas content which remains in the liquid is proportional to the saturation level and the applied vacuum level. If on the gas side of the membrane, a vacuum is applied without or with a very small gas flow past the membrane, diffusion of the gas out of the liquid through the membrane will limit the lowest achievable partial pressure level of the gas at the gas side of the membrane. However, even with a gas flow, the amount of de-gassing achievable is limited. In the case of applying a vacuum to one side of the membrane which is below the vapor pressure of the liquid to be de-gassed, the semi-permeable membrane is blocked by vapor of the liquid and so the de-gassing process does not continue. This limits the level of vacuum which can usefully be used and thereby the lowest concentration of gas in the liquid.

The examples given below are all for water as the liquid, but an embodiment of the invention is applicable to any liquid, such as a top coat. By providing an inert or other stable gas, such as nitrogen, at ambient pressure on one side of the semi-permeable membrane, the total gas concentration in parts per billion in the liquid can be 19000 parts per billion. If an inert or other stable gas, such as nitrogen, is used with an under-pressure below atmospheric pressure in the region of 3000 Pa (0.3 atm) (i.e. just under the vapor pressure of water which is 2700 Pa), for example, the concentration of gas in the liquid can be reduced to as little as 578 parts per billion. If a vacuum alone is used (3000 Pa or 0.3 atm), the concentration of gas can be reduced to 727 parts per billion. However, these levels may not be considered low enough and an embodiment of the present invention can achieve a total gas concentration in the liquid of below 200 parts per billion and in some embodiments lower than 50 or even lower than 5 parts per billon. As will be appreciated, any under pressure will help reduce the concentration of gas in the liquid, even 0.95 atm.

Figure 6:
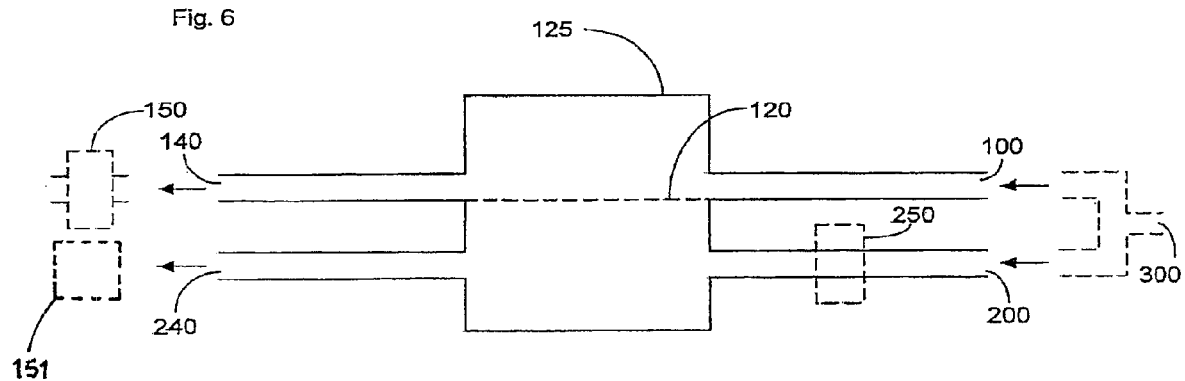
FIG. 6 depicts an apparatus for de-gassing a liquid according to an embodiment of the invention.

An embodiment of the apparatus of the present invention is shown schematically in FIG. 6. Liquid to be de-gassed is provided to a inlet 100 and flows past a semi-permeable membrane 120. After being de-gassed, the liquid proceeds to outlet 140. A chamber 125 may be provided adjacent the semi-permeable membrane so that liquid spends more time in the vicinity of the semi-permeable membrane 120. A gas is provided to inlet 200 and forced to flow past the semi-permeable membrane 120. The gas continues to exit 240. The gas may either be allowed to escape to the atmosphere or be re-cycled. The gas can be provided at an under pressure, at a level at least above the vapor pressure of the liquid.

In a first embodiment, the gas which is provided on the side of the semi-permeable membrane 120 opposite to that of the liquid to be de-gassed is vapor of the liquid to be de-gassed. In this instance, it is possible to reduce the concentration of gas in the liquid to below 50 parts per billion. A concentration of 36 parts per billion is theoretically possible. A typical gas flow rate would be 2 L/minute and a typical liquid flow rate would be 1 L/minute with a semi-permeable membrane surface area of about 1 m², depending on the level of equilibrium which it is desired to achieve. An optimal range of flow rate would be between 0.1 and 10 L/minute and a surface area of the membrane of 0.5 to 5 m² could typically be used.

In this embodiment, it is possible to provide a single liquid inlet 300 which provides liquid to both inlets 100 and 200. A liquid vaporizer 250 is provided between the inlet 200 and the semi-permeable membrane 120 to vaporize the liquid. A condenser may be provided downstream of outlet 240 so that the liquid may be re-cycled. In an embodiment, the liquid is water.

By using the vapor of the liquid as a sweep gas to de-gas the liquid, a flow is generated at the gas side of the membrane causing lower partial pressure gas to be removed from the liquid at the gas side of the membrane. Because of the lower partial pressure level at the gas side, the liquid is de-gassed to a significantly lower level than when a vacuum is applied or a sweep gas is used from a composition other than the liquid vapor. This means that de-gassing may be orders of magnitude more effective than using only a vacuum or an inert or other stable gas as a sweep gas.

In a second embodiment, the gas which is used on the side of the membrane 120 opposite to the liquid is a gas which dissociates into ions when dissolved in the liquid. A good example of such a gas is carbon dioxide (when the liquid is water). A flow of carbon dioxide is generated on the side of the membrane 120 opposite the liquid and this causes a significantly lower partial pressure gas to be removed from the liquid. Thus, by using carbon dioxide under a low supplied pressure, the partial pressure of all other contaminants is equal to the supplied pressure times the contamination level in the carbon dioxide. Thus, the partial pressure of nitrogen in a carbon dioxide sweep gas at 3000 Pa with 5000 ppm nitrogen is 15 Pa. Because of the lower partial pressure level at the gas side of the membrane, the liquid is de-gassed to a significantly lower level than when a vacuum is applied at the gas side. A gas that dissociates into ions when dissolved in liquid will be absorbed through the membrane into the liquid, but may later effectively be removed by means of an ion exchanger 150 which is provided downstream of outlet 140. The level of de-gassing maybe reduced even further by applying the carbon dioxide at an under-pressure. The following table shows the theoretical lowest achievable equilibrium concentrations under a variety of conditions using carbon dioxide to de-gas water using a hollow Teflon fiber membrane.

| Gas | Pressure (atm) | Concentration of gas in liquid (ppb) |
|---|---|---|
| Liquid vapor | 0.03 | 36 |
| $CO_2$ (5000 ppm purity) | 1 | 121 |
| $CO_2$ (5000 ppm purity) | 0.03 | 3.6 |
| $CO_2$ (80 ppm purity) | 1 | 0.48 |
| $CO_2$ (80 ppm purity) | 0.03 | 0.015 |

The results in Table 1 are calculated on the basis of an infinite semi-permeable membrane contact area.

Figure 7:
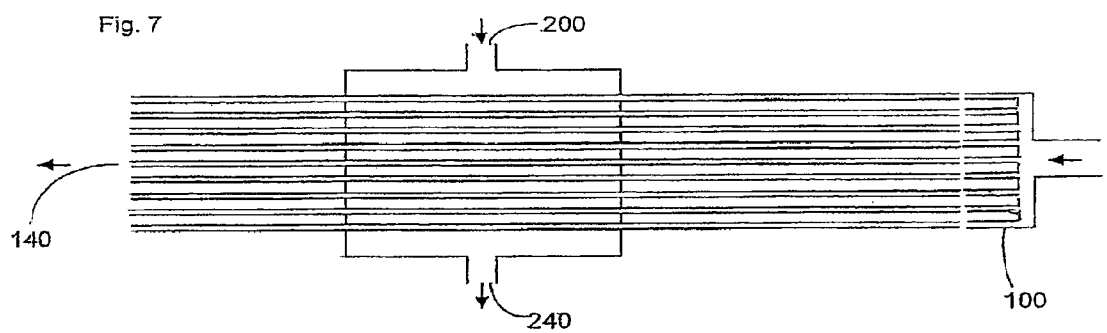
FIG. 7 illustrates another apparatus for de-gassing a liquid according to an embodiment of the invention.

A further refinement of an embodiment of the apparatus according to the invention is illustrated in FIG. 7 in which like reference numerals indicate similar objects to those in FIG. 6 and in which it can be seen that a plurality of tubes are provided, all of which are made of a semi-permeable membrane. This is one way of increasing the surface area of the semi-permeable membrane and therefore the efficiency of the de-gassing process.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space maybe a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. An apparatus configured to de-gas a liquid, the apparatus comprising:
   a semi-permeable membrane having a first side on which the liquid is provided; and
   (i) a vaporizer configured to provide vapor of the liquid to a second side of the membrane; or
   (ii) a gas inlet configured to provide a gas to the second side of the membrane at a pressure substantially equal to or lower than one atmosphere, the gas adapted to dissociate when dissolved in the liquid, wherein the gas is carbon dioxide.

2. The apparatus of claim 1, wherein the pressure is less than 0.5 atmosphere.

3. The apparatus of claim 2, wherein the pressure is less than 0.05 atmosphere.

4. The apparatus of claim 1, wherein the gas dissociates into ions when dissolved in the liquid, the apparatus further comprising an ion exchanger configured to remove said ions from the liquid.

5. The apparatus of claim 1, wherein a gas concentration in the liquid downstream of the membrane is less than about 200 parts per billion.

6. The apparatus of claim 1, wherein the membrane includes a plurality of tubes.

7. An apparatus configured to de-gas a liquid, the apparatus comprising:
   a semi-permeable membrane having a first side on which the liquid is provided; and
   (i) a vaporizer configured to provide vapor of the liquid to a second side of the membrane; or
   (ii) a gas inlet configured to provide carbon dioxide to the second side of the membrane.

8. The apparatus of claim 7, wherein carbon dioxide is at a pressure substantially equal to or lower than one atmosphere.

9. The apparatus of claim 8, wherein the pressure is less than 0.5 atmosphere.

10. The apparatus of claim 9, wherein the pressure is less than 0.05 atmosphere.

11. The apparatus of claim 7, comprising an ion exchanger configured to remove ions from the liquid, said ions resulting from the dissociation of carbon dioxide in the liquid.

12. A lithographic apparatus comprising:
an apparatus configured to de-gas a liquid, the apparatus comprising:
a semi-permeable membrane having a first side on which the liquid is provided; and
(i) a vaporizer configured to provide vapor of the liquid to a second side of the membrane; or
(ii) a gas inlet configured to provide a gas to the second side of the membrane at a pressure substantially equal to or lower than one atmosphere, the gas adapted to dissociate when dissolved in the liquid; and
a liquid confinement structure configured to confine the de-gassed liquid in a space between a substrate and a projection system configured to project a radiation beam onto the substrate such that the radiation beam will pass through the de-gassed liquid.

13. The apparatus of claim 12, wherein the gas is carbon dioxide.

14. The apparatus of claim 12, wherein the pressure is less than 0.5 atmosphere.

15. The apparatus of claim 12, wherein the gas dissociates into ions when dissolved in the liquid, the apparatus further comprising an ion exchanger configured to remove said ions from the liquid.

16. A lithographic apparatus comprising:
an apparatus configured to de-gas a liquid, the apparatus comprising:
a semi-permeable membrane having a first side on which the liquid is provided; and
(i) a vaporizer configured to provide vapor of the liquid to a second side of the membrane; or
(ii) a gas inlet configured to provide carbon dioxide to the second side of the membrane; and
a liquid confinement structure configured to confine the de-gassed liquid in a space between a substrate and a projection system configured to project a radiation beam onto the substrate such that the radiation beam will pass through the de-gassed liquid.

17. The apparatus of claim 16, wherein carbon dioxide is at a pressure substantially equal to or lower than one atmosphere.

18. The apparatus of claim 17, wherein the pressure is less than 0.5 atmosphere.

19. The apparatus of claim 16, comprising an ion exchanger configured to remove ions from the liquid, said ions resulting from the dissociation of carbon dioxide in the liquid.

* * * * *